United States Patent
Mayr et al.

(10) Patent No.: US 11,505,562 B2
(45) Date of Patent: Nov. 22, 2022

(54) PROCESS FOR THE GENERATION OF METAL-CONTAINING FILMS

(71) Applicants: BASF SE, Ludwigshafen am Rhein (DE); Wayne State University, Detroit, MI (US)

(72) Inventors: Lukas Mayr, Ludwigshafen (DE); David Dominique Schweinfurth, Ludwigshafen (DE); Daniel Waldmann, Ludwigshafen (DE); Charles Hartger Winter, Detroit, MI (US); Kyle Blakeney, Detroit, MI (US); Sinja Verena Klenk, Ludwigshafen (DE); Sabine Weiguny, Ludwigshafen (DE); Nilanka Weerathunga Sirikkathuge, Detroit, MI (US); Tharindu Malawara Arachchige Nimanthaka Karunaratne, Detroit, MI (US)

(73) Assignees: BASF SE, Ludwigshafen am Rhein (DE); Wayne State University, Detroit, MI (US)

( * ) Notice: Subject to any disclaimer, the term of this patent is extended or adjusted under 35 U.S.C. 154(b) by 0 days.

(21) Appl. No.: 16/954,371

(22) PCT Filed: Nov. 9, 2018

(86) PCT No.: PCT/EP2018/080738
§ 371 (c)(1),
(2) Date: Jun. 16, 2020

(87) PCT Pub. No.: WO2019/120743
PCT Pub. Date: Jun. 27, 2019

(65) Prior Publication Data
US 2021/0079025 A1    Mar. 18, 2021

Related U.S. Application Data

(60) Provisional application No. 62/763,125, filed on Dec. 20, 2017, provisional application No. 62/763,136, filed on Mar. 7, 2018.

(51) Int. Cl.
| | | |
|---|---|---|
| C23C 16/20 | (2006.01) |
| C07F 5/06 | (2006.01) |
| C23C 16/08 | (2006.01) |
| C23C 16/455 | (2006.01) |
| C23C 16/12 | (2006.01) |

(52) U.S. Cl.
CPC .............. *C07F 5/069* (2013.01); *C07F 5/067* (2013.01); *C23C 16/08* (2013.01); *C23C 16/12* (2013.01); *C23C 16/20* (2013.01); *C23C 16/45534* (2013.01); *C23C 16/45553* (2013.01)

(58) Field of Classification Search
CPC ......... C23C 16/20; C23C 16/06; C23C 16/08; C23C 16/45553; C23C 16/45534
See application file for complete search history.

(56) References Cited

U.S. PATENT DOCUMENTS

| | | | |
|---|---|---|---|
| 5,874,131 A | 2/1999 | Vaartstra et al. | |
| 5,880,303 A * | 3/1999 | Choi | C07F 5/069 556/176 |
| 6,380,383 B1 * | 4/2002 | Shin | C07F 5/066 549/3 |
| 6,602,356 B1 * | 8/2003 | Nagaraj | C23C 10/52 427/253 |
| 7,547,631 B2 * | 6/2009 | Shenai-Khatkhate | C07F 9/5045 556/18 |

(Continued)

FOREIGN PATENT DOCUMENTS

| | | |
|---|---|---|
| CN | 105585445 A | 5/2016 |
| EP | 1335416 A1 | 8/2003 |

(Continued)

OTHER PUBLICATIONS

Hatanpaa, Timo, et al., "Precursors as enablers of ALD technology: Contributions from University of Helsinki". Coordination Chemistry Reviews 257 (2013) 3297-3322.*

(Continued)

*Primary Examiner* — Bret P Chen
(74) *Attorney, Agent, or Firm* — Armstrong Teasdale LLP

(57) ABSTRACT

Described herein is a process for preparing inorganic metal-containing films including bringing a solid substrate in contact with a compound of general formula (I) or (II) in the gaseous state

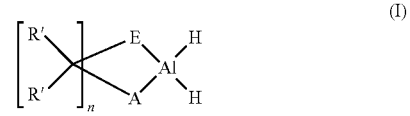

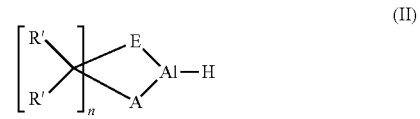

where A is NR₂ or OR with R being an alkyl group, an alkenyl group, an aryl group, or a silyl group,
E is NR or O,
n is 1, 2 or 3, and
R' is hydrogen, an alkyl group, an alkenyl group, an aryl group, or a silyl group,
wherein if n is 2 and E is NR or A is OR, at least one R in NR or OR bears no hydrogen atom in the 1-position.

7 Claims, 4 Drawing Sheets

(56) References Cited

U.S. PATENT DOCUMENTS

| | | | |
|---|---|---|---|
| 8,124,179 B2* | 2/2012 | Nilsen | C23C 16/45555 427/255.6 |
| 8,927,059 B2 | 1/2015 | Lu et al. | |
| 9,245,740 B2* | 1/2016 | Jang | C23C 16/345 |
| 2002/0013487 A1 | 1/2002 | Norman et al. | |
| 2003/0135061 A1* | 7/2003 | Norman | C07F 5/02 556/9 |
| 2003/0232811 A1* | 12/2003 | Tsuchiya | C07C 323/60 514/227.5 |
| 2006/0088660 A1* | 4/2006 | Putkonen | C23C 16/45531 427/248.1 |
| 2007/0009674 A1* | 1/2007 | Okubo | G02F 1/1333 428/1.4 |
| 2008/0076760 A1 | 3/2008 | Ohtake | |
| 2008/0300359 A1* | 12/2008 | Hoshi | C08F 220/382 524/588 |
| 2009/0023940 A1* | 1/2009 | Lipiecki | B01D 3/14 556/27 |
| 2009/0226612 A1 | 9/2009 | Ogawa et al. | |
| 2010/0063294 A1 | 3/2010 | Kuriyama et al. | |
| 2010/0069681 A1 | 3/2010 | Heimann et al. | |
| 2010/0301478 A1* | 12/2010 | Waechtler | H01L 21/76873 257/741 |
| 2011/0084230 A1* | 4/2011 | Knochel | C07F 3/06 252/182.3 |
| 2013/0251903 A1* | 9/2013 | Han | C07F 15/045 427/252 |
| 2015/0004314 A1* | 1/2015 | Winter | C01G 3/05 427/252 |
| 2015/0159273 A1* | 6/2015 | Winter | C22B 23/00 423/592.1 |
| 2015/0166576 A1* | 6/2015 | Dussarrat | C23C 16/345 427/255.28 |
| 2016/0152650 A1* | 6/2016 | Winter | C07F 13/005 427/255.28 |
| 2016/0348243 A1* | 12/2016 | Xu | C07F 15/065 |
| 2019/0284686 A1* | 9/2019 | Melnik | F01D 25/12 |
| 2021/0147450 A1 | 5/2021 | Han et al. | |

FOREIGN PATENT DOCUMENTS

| | | |
|---|---|---|
| EP | 1788116 A1 | 5/2007 |
| WO | 2006051851 A1 | 5/2006 |
| WO | 2010019844 A1 | 2/2010 |
| WO | 2016177655 A1 | 11/2016 |
| WO | 2017093265 A1 | 6/2017 |
| WO | 2018069130 A1 | 4/2018 |
| WO | 2018077684 A1 | 5/2018 |
| WO | 2018108628 A1 | 6/2018 |

OTHER PUBLICATIONS

Parsons, Gregory N., et al., "Progress and future directions for atomic layer deposition and ALD-based chemistry". MRS Bulletin, vol. 36(11), Nov. 2011, pp. 865-871.*

Tanskanen, A., et al., "Iron-Terephthalate Coordination Network Thin Films Through In-Situ Atomic/Molecular Layer Deposition". Scientific Reports (2018) 8: 8976, pp. 1-8.*

Leslela, Markku, et al., "Atomic layer deposition (ALD): from precursors to thin film structures". Thin Solid Films 409 (2002) 138-146.*

Pore, Viljami, et al., "Atomic Layer Deposition of Metal Tellurides and Selenides Using Alkylsilyl Compounds of Tellurium and Selenium". J. Am. Chem. Soc., 2009, 131, 3478-3480.*

Glass, John A, Jr., et al., "Chemical Vapor Deposition Precursor Chemistry. 2. Formation of Pure Aluminum, Alumina, and Aluminum Boride Thin Films from Boron-Containing Precursor Compounds by Chemical Vapor Deposition". Chem. Mater. 1992, 4, 530-538.*

Riedel, Ralf, et al., "Formation and Characterization of Amorphous Aluminum Nitride Powder and Transparent Aluminum Nitride Film by Chemical Vapor Deposition". J. Am. Ceram. Soc. 74 (6) 1331-1334 (1991).*

Schmidt, Benjamin, et al., "Metal-organic chemical vapor deposition of aluminum oxide thin films via pyrolysis of dimethylaluminum isopropoxide". J. Vac. Sci. Technol. A 28(2), Mar./Apr. 2010, pp. 238-243.*

International Search Report and Written Opinion for corresponding PCT/EP2018/080738 dated Feb. 21, 2019, 9 pages.

Afonso, et al., "Synthesis of 2,4,6-Tri-substituted-1,3,5-Triazines", Molecules, vol. 11, Issue 1, Jan. 31, 2006, pp. 81-102.

Alexander, et al., "Studies on the Mechanism of the Mannich Reaction. I. Ethylmalonic Acid, A Methynyl Compound", Journal of the American Chemical Society, vol. 71, Issue 12, Dec. 1, 1949, pp. 4014-4019.

Cortes, et al., "Selective reductions of 3-substituted hydantoins to 4-hydroxy-2-imidazolidinones and vicinal diamines", The Journal of Organic Chemistry, vol. 48, Issue 13, Jul. 1, 1983, pp. 2246-2254.

Dale, et al., "Condensation of alkanediamines with formaldehyde; intramolecular disproportionation of N-hydroxymethyl groups into N-methyl and N-formyl groups", Acta Chemica Scandinavica, vol. 45, 1991, pp. 1064-1070.

Heaton, et al., "Preparation, crystal structure and mechanism of formation of a novel dinuclear carbopentazane complex, [Rh2(PPh3)4{(NH2NH)2CH2}][NO3]2", Journal of the Chemical Society, Dalton Transactions, Issue 1, 1996, pp. 61-67.

Popr, et al., "A complete series of 6-deoxy-monosubstituted tetraalkylammonium derivatives of α-, β-, and γ-cyclodextrin with 1, 2, and 3 permanent positive charges", Journal of Organic Chemistry, vol. 10, Jun. 18, 2014, pp. 1390-1396.

Ram, et al., "Debenzylation of N-benzylamino derivatives by catalytic transfer hydrtyation with ammonium formate", Synthetic Communications, vol. 17, Issue 4, 1987, pp. 415-418.

Rosenau, et al., "A solvent-free and formalin-free Eschweiler-Clarke methylation for amines", Synthetic Communications, vol. 32, Issue 3, 2002, pp. 457-466.

Spasyuk, et al., "Acceptorless Dehydrogenative Coupling of Ethanol and Hydrogenation of Esters and Imines", Organometallics, vol. 31, Issue 15, Jul. 24, 2012, pp. 5239-5242.

Cha, et al., "Conversion of carboxylic acids to aldehydes with cyclic dialkyldiaminoaluminum hydrides", Bulletin of the Korean Chemical Society, vol. 23, Issue 9, Mar. 19, 2002, pp. 1340-1342.

* cited by examiner

PROCESS FOR THE GENERATION OF METAL-CONTAINING FILMS

CROSS-REFERENCE TO RELATED APPLICATIONS

This application is a U.S. National Phase Application of PCT/EP2018/080738, filed Nov. 9, 2018, which claims the benefit of priority to U.S. Provisional Patent Application 62/763,125, filed Dec. 20, 2017, and which claims the benefit of priority to U.S. Provisional Patent Application 62/763,136, filed Mar. 7, 2018, the entire contents of which are hereby incorporated by reference herein.

FIELD OF THE INVENTION

The present invention is in the field of processes for the generation of inorganic metal-containing films on substrates, in particular atomic layer deposition processes.

BACKGROUND OF THE INVENTION

With the ongoing miniaturization, e.g. in the semiconductor industry, the need for thin inorganic films on substrates increases while the requirements on the quality of such films become stricter. Thin inorganic metal-containing films serve different purposes such as barrier layers, conducting features, or capping layers. Several methods for the generation of inorganic metal-containing films are known. One of them is the deposition of film forming compounds from the gaseous state on a substrate. In order to bring metal atoms into the gaseous state at moderate temperatures, it is necessary to provide volatile precursors, e.g. by complexation of the metals with suitable ligands. These precursors need to be sufficiently stable for evaporation, but on the other hand they need to be reactive enough to react with the surface of deposition.

If a metal film is desired as inorganic metal-containing film, it is usually necessary to expose the deposited metal complex to a reducing agent. Typically, hydrogen gas is used to convert deposited metal complexes to metal films. While hydrogen works reasonably well as reducing agent for relatively noble metals like copper or silver, it does not yield satisfactory results for more electropositive metals such as titanium or aluminum.

U.S. Pat. No. 8,927,059 discloses a depositing pure metal and aluminum alloy metal films using aluminum hydride precursors. However, these precursors turn out to be of insufficient stability to achieve optimum results.

DESCRIPTION OF THE INVENTION

It was therefore an object of the present invention to provide a process for preparing inorganic metal-containing films having less impurity in the film. The process materials should be easy to handle; in particular, it should be possible to vaporize them with as little decomposition as possible. Further, the process material should not decompose at the deposition surface under process conditions but at the same time it should have enough reactivity to participate in the surface reaction. All reaction by-products should be volatile to avoid film contamination. In addition, it should be possible to adjust the process such that metal atoms in the process material are either volatile or are incorporated in the film. Furthermore, the process should be versatile, so it can be applied to produce a broad range of different metals including electropositive metal films.

These objects were achieved by a process for preparing inorganic metal-containing films comprising bringing a solid substrate in contact with a compound of general formula (I) or (II) in the gaseous state

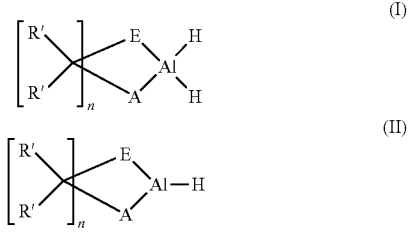

wherein A is $NR_2$ or OR with R being an alkyl group, an alkenyl group, an aryl group, or a silyl group,
E is NR or O,
n is 1, 2 or 3, and
R' is hydrogen, an alkyl group, an alkenyl group, an aryl group, or a silyl group, wherein if n is 2 and E is NR or A is OR, at least one R in NR or OR bears no hydrogen atom in the 1-position.

The present invention further relates to a compound of general formula (I) or (II)

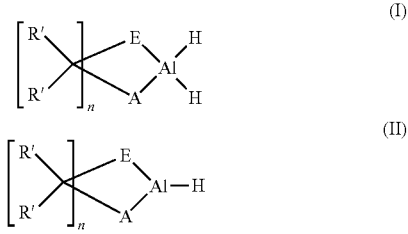

wherein A is $NR_2$ or OR with R being an alkyl group, an alkenyl group, an aryl group, or a silyl group,
E is NR or O,
n is 0, 1 or 2, m is 0, 1 or 2, and
R' is hydrogen, an alkyl group, an alkenyl group, an aryl group, or a silyl group, wherein if n is 2 and E is NR or A is OR, at least one R in NR or OR bears no hydrogen atom in the 1-position.

Preferred embodiments of the present invention can be found in the description and the claims. Combinations of different embodiments fall within the scope of the present invention.

The process according to the present invention is suitable for preparing inorganic metal-containing films. Inorganic metal-containing in the context of the present invention refers to materials which contain at least 5 wt.-% of at least one metal, preferably at least 10 wt.-%, more preferably at least 20 wt.-%, in particular at least 30 wt.-%. Inorganic films typically contain carbon only in the form of a carbide phase including mixed carbide phases such as nitride carbide phases.

The carbon content of carbon which is not part of a carbide phase in an inorganic film is preferably less than 5 wt.-%, more preferable less than 1 wt.-%, in particular less than 0.2 wt.-%. Preferred examples of inorganic metal-containing films are metal nitride films, metal carbide films, metal carbonitride films, metal alloy films, intermetallic compound films or films containing mixtures thereof.

The film prepared by the process according to the present invention contains metal. It is possible that the film contains one metal or more than one metal. Metals include Li, Be, Na, Mg, Al, K, Ca, Sc, Ti, V, Cr, Mn, Fe, Co, Ni, Cu, Zn, Ga, Ge, Rb, Sr, Y, Zr, Nb, Mo, Tc, Ru, Rh, Pd, Ag, Cd, In, Sn, Sb, Te, Cs, Ba, La, Ce, Pr, Nd, Pm, Sm, Eu, Gd, Tb, Dy, Ho, Er, Tm, Yb, Lu, Hf, Ta, W, Re, Os Ir, Pt, Au, Hg, Tl, Pb, Bi. As the process according to the present invention is versatile with regard to the metal, the metal can be more electropositive than Cu, more preferably more electropositive than Ni. In particular, the metal-containing compound contains Ti, Ta, Mn, Mo, W, Al, Co, Ga, Ge, Sb, or Te.

The solid substrate can be any solid material. These include for example metals, semimetals, oxides, nitrides, and polymers. It is also possible that the substrate is a mixture of different materials. Examples for metals are aluminum, steel, zinc, and copper. Examples for semimetals are silicon, germanium, and gallium arsenide. Examples for oxides are silicon dioxide, titanium dioxide, and zinc oxide. Examples for nitrides are silicon nitride, aluminum nitride, titanium nitride, and gallium nitride. Examples for polymers are polyethylene terephthalate (PET), polyethylene naphthalene-dicarboxylic acid (PEN), and polyamides.

The solid substrate can have any shape. These include sheet plates, films, fibers, particles of various sizes, and substrates with trenches or other indentations. The solid substrate can be of any size. If the solid substrate has a particle shape, the size of particles can range from below 100 nm to several centimeters, preferably from 1 µm to 1 mm. In order to avoid particles or fibers to stick to each other while the metal-containing compound is deposited onto them, it is preferably to keep them in motion. This can, for example, be achieved by stirring, by rotating drums, or by fluidized bed techniques.

According to the present invention the solid substrate is brought in contact with a compound of general formula (I) or (II) in the gaseous phase. R' in the compound of general formula (I) or (II) is hydrogen, an alkyl group, an alkenyl group, an aryl group, or a silyl group, preferably hydrogen. The R' can be the same or different to each other. Preferably, all R' are hydrogen.

An alkyl group can be linear or branched. Examples for a linear alkyl group are methyl, ethyl, n-propyl, n-butyl, n-pentyl, n-hexyl, n-heptyl, n-octyl, n-nonyl, n-decyl. Examples for a branched alkyl group are iso-propyl, iso-butyl, sec-butyl, tert-butyl, 2-methyl-pentyl, neo-pentyl, 2-ethyl-hexyl, cyclopropyl, cyclohexyl, indanyl, norbornyl. Preferably, the alkyl group is a $C_1$ to $C_8$ alkyl group, more preferably a $C_1$ to $C_6$ alkyl group, in particular a $C_1$ to $C_4$ alkyl group, such as methyl, ethyl, iso-propyl or tert-butyl.

An alkenyl group contains at least one carbon-carbon double bond. The double bond can include the carbon atom with which R' is bound to the rest of the molecule, or it can be placed further away from the place where R' is bound to the rest of the molecule. Alkenyl groups can be linear or branched. Examples for linear alkenyl groups in which the double bond includes the carbon atom with which R' is bound to the rest of the molecule include 1-ethenyl, 1-propenyl, 1-n-butenyl, 1-n-pentenyl, 1-n-hexenyl, 1-n-heptenyl, 1-n-octenyl. Examples for linear alkenyl groups in which the double bond is placed further away from the place where R' is bound to the rest of the molecule include 1-n-propen-3-yl, 2-buten-1-yl, 1-buten-3-yl, 1-buten-4-yl, 1-hexen-6-yl. Examples for branched alkenyl groups in which the double bond includes the carbon atom with which R' is bound to the rest of the molecule include 1-propen-2-yl, 1-n-buten-2-yl, 2-buten-2-yl, cyclopenten-1-yl, cyclohexen-1-yl. Examples for branched alkenyl groups in which the double bond is placed further away from the place where R' is bound to the rest of the molecule include 2-methyl-1-buten-4-yl, cyclopenten-3-yl, cyclohexene-3-yl. Examples for an alkenyl group with more than one double bonds include 1,3-butadien-1-yl, 1,3-butadien-2-yl, cylopentadien-5-yl.

Aryl groups include aromatic hydrocarbons such as phenyl, naphthalyl, anthrancenyl, phenanthrenyl groups and heteroaromatic groups such as pyrryl, furanyl, thienyl, pyridinyl, quinoyl, benzofuryl, benzothiophenyl, thienothienyl. Several of these groups or combinations of these groups are also possible like biphenyl, thienophenyl or furanylthienyl. Aryl groups can be substituted for example by halogens like fluoride, chloride, bromide, iodide; by pseudohalogens like cyanide, cyanate, thiocyanate; by alcohols; alkyl chains or alkoxy chains. Aromatic hydrocarbons are preferred, phenyl is more preferred.

A silyl group is a silicon atom with typically three substituents. Preferably a silyl group has the formula $SiX_3$, wherein X is independent of each other hydrogen, an alkyl group, an aryl group or a silyl group. It is possible that all three X are the same or that two A are the same and the remaining X is different or that all three X are different to each other, preferably all X are the same. Alkyl and aryl groups are as described above. Examples for silyl groups include $SiH_3$, methylsilyl, trimethylsilyl, triethylsilyl, tri-n-propylsilyl, tri-iso-propylsilyl, tricyclohexylsilyl, dimethyl-tert-butylsilyl, dimethylcyclohexylsilyl, methyl-di-iso-propylsilyl, triphenylsilyl, phenylsilyl, dimethylphenylsilyl, pentamethyldisilyl.

A in the compound of general formula (I) or (II) is $NR_2$ or OR, i.e. a nitrogen atom bearing two substituents R or an oxygen atom bearing one substituent R. R is an alkyl group, an alkenyl group, an aryl group, or a silyl group. The same definitions and preferred embodiments apply as for R' described above unless expressly described differently. Preferably, R is methyl, ethyl, tert-butyl or trimethylsilyl. Also preferably, if A is $NR_2$ two R form together a five-membered ring including the nitrogen atom, in particular the two R are a —$CH_2$—$CH_2$—$CH_2$-$CH_2$— group in the five-membered ring including the nitrogen atom.

E in the compound of general formula (I) or (II) is NR or O, i.e. a nitrogen atom bearing one substituent R or an oxygen atom. The definition for R in E is the same as for R in A.

The variable n can be 0, 1 or 2, the variable m can be 0, 1 or 2, preferably, n+m is 1, 2, 3 or 4, more preferably, n is 1 or 2 and m is 1 or 2, even more preferably, n is 1 and m is 1 or n is 2 and m is 2.

It is possible that all R' and R are separate substituents. Alternatively, it is possible that two R' or two R or an R' and an R together form a ring, preferably a four to eight-membered ring, in particular a five- or six-membered ring.

If n is 1, the compound of general formula (I) becomes one of the following general formulae.

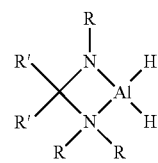

(Ia)

(Ib) 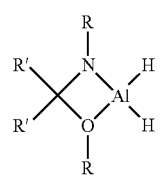
(Ic) 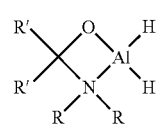
(Id) 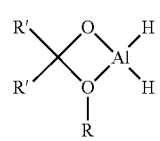
Some preferred examples for compounds of general formula (Ia) to (Id) are shown below.
(Ia-1) 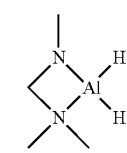
(Ia-2) 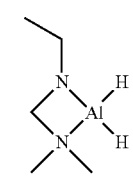
(Ia-3) 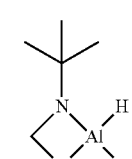
(Ia-4) 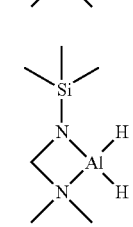
(Ia-5) 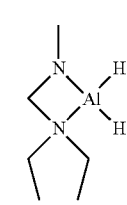
(Ia-6) 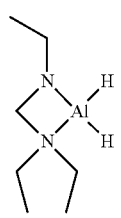
(Ia-7) 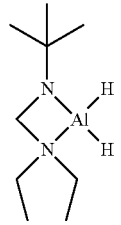
(Ia-8) 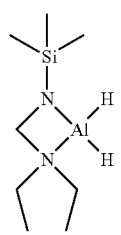
(Ia-9) 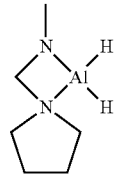
(Ia-10) 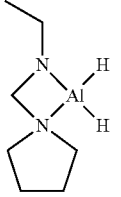
(Ia-11) 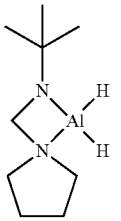
(Ia-12) 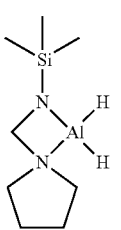

-continued
(Ib-1) 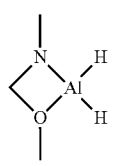
(Ib-2) 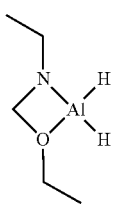
(Ib-3) 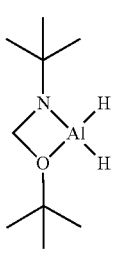
(Ib-4) 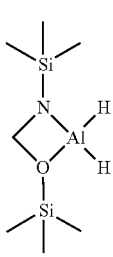
(Ic-1) 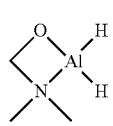
(Ic-2) 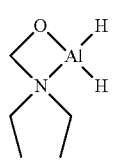
(Ic-3) 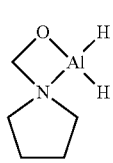
(Id-1) 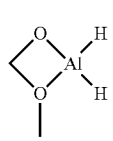
(Id-2) 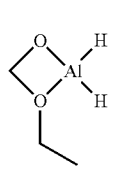
(Id-3) 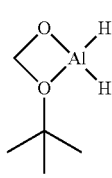
(Id-4) 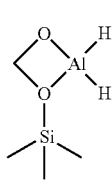 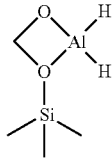
If n is 2, the compound of general formula (I) becomes one of the following general formulae.
(Ie) 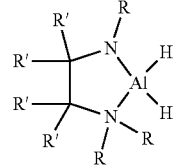
(If) 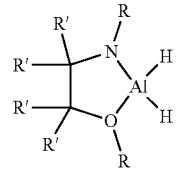
(Ig) 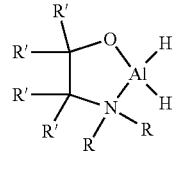
(Ih) 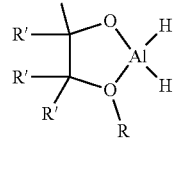
Some preferred examples for compounds of general formula (Ie) to (Ih) are shown below.
(Ie-1) 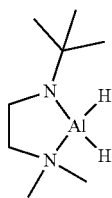

(Ie-2)
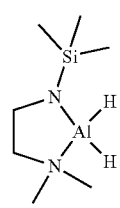
(Ie-3)
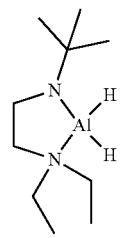
(Ie-4)
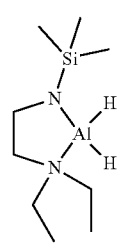
(Ie-5)
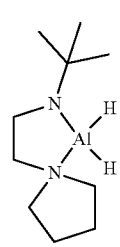
(Ie-6)
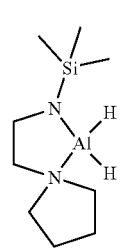
(Ie-7)
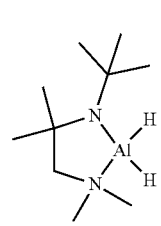
(If-1)
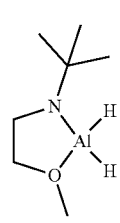
(If-2)
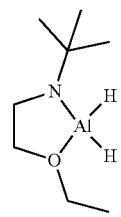
(If-3)
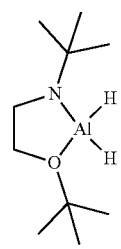
(If-4)
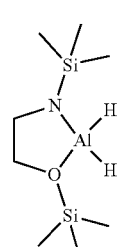
(Ig-1)
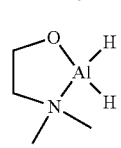
(Ig-2)
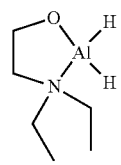
(Ig-3)
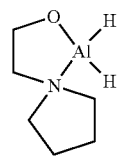
(Ih-1)
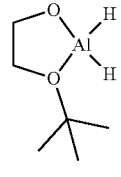
(Ih-2)
If n is 3, the compound of general formula (I) becomes one of the following general formulae.

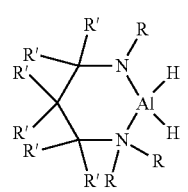
(Ii)
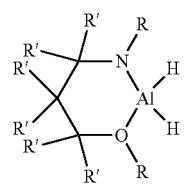
(Ij)
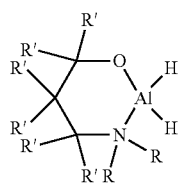
(Ik)
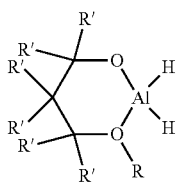
(Im)
Some preferred examples for compounds of general formula (Ii) to (Im) are shown below.
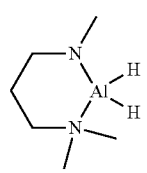
(Ii-1)
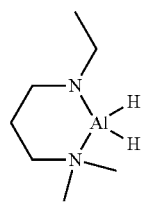
(Ii-2)
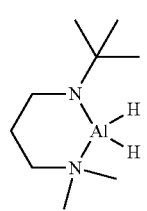
(Ii-3)
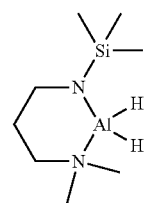
(Ii-4)
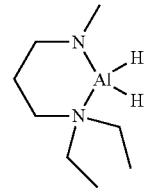
(Ii-5)
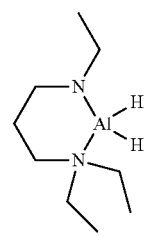
(Ii-6)
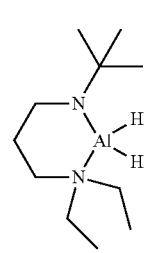
(Ii-7)
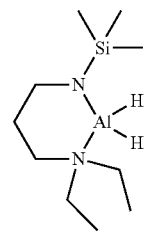
(Ii-8)
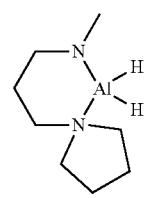
(Ii-9)
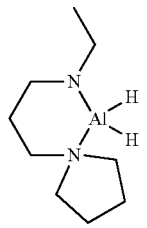
(Ii-10)

-continued
(Ii-11)
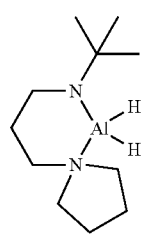
(Ii-12)
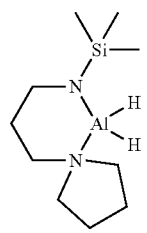
(Ij-1)
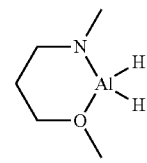
(Ij-2)
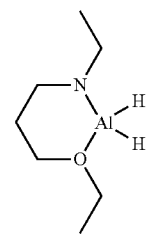
(Ij-3)
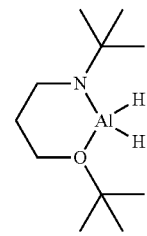
(Ij-4)
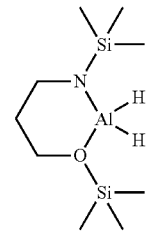
(Ik-1)
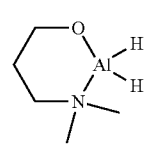
-continued
(Ik-2)
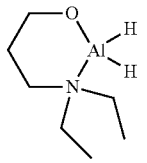
(Ik-3)
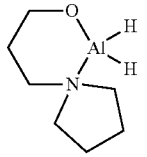
(Im-1)
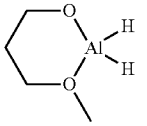
(Im-2)
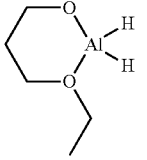
(Im-3)
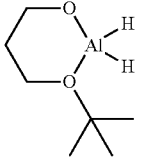
(Im-4)
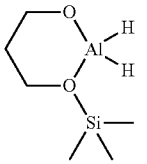
If n is 1, the compound of general formula (II) becomes one of the following general formulae.
(IIa)
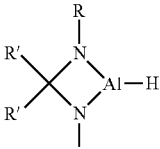
(IIb)
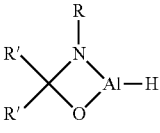
(IIc)
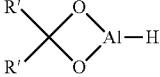
Some preferred examples for compounds of general formula (IIa) to (IIc) are shown below.

(IIa-1) 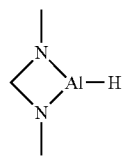
(IIa-2) 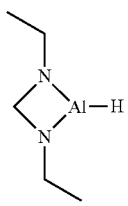
(IIa-3) 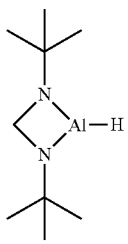
(IIa-4) 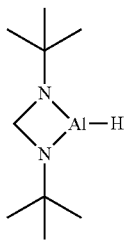
(IIa-5) 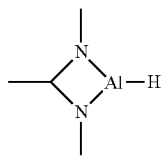
(IIb-1) 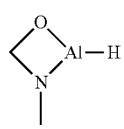
(IIb-2) 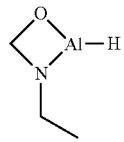
(IIb-3) 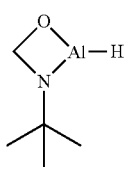
(IIb-4) 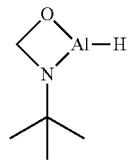
(IIb-5) 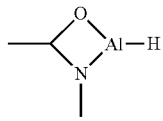
(IIc-1) 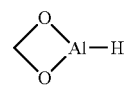
(IIc-2) 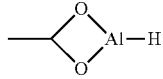
(IIc-3) 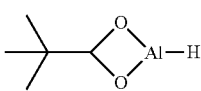
(IIc-4) 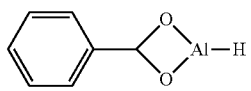
If n is 2, the compound of general formula (II) becomes one of the following general formulae.
(IId) 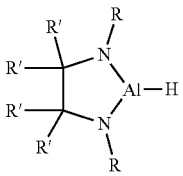
(IIe) 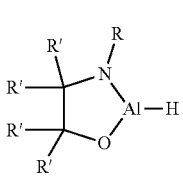
(IIf) 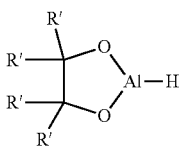
Some preferred examples for compounds of general formula (IId) to (IIf) are shown below.

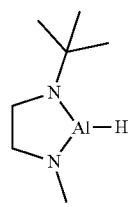 (IId-1)
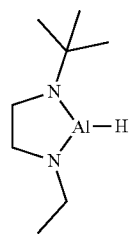 (IId-2)
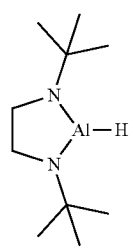 (IId-3)
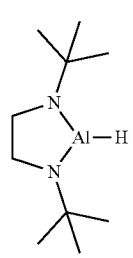 (IId-4)
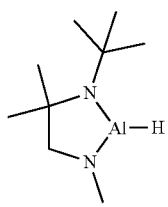 (IId-5)
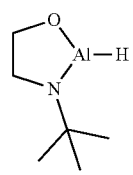 (IIe-1)
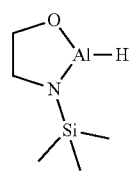 (IIe-2)
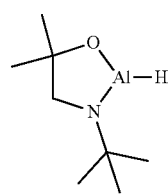 (IIe-3)
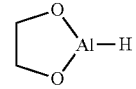 (IIf-1)
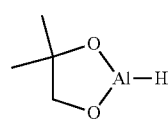 (IIf-5)
If n is 3, the compound of general formula (II) becomes one of the following general formulae.
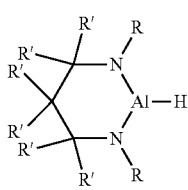 (IIg)
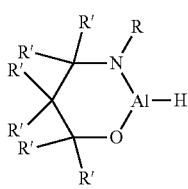 (IIh)
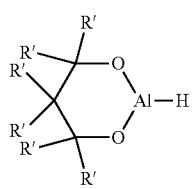 (IIi)
Some preferred examples for compounds of general formula (IIg) to (IIi) are shown below.
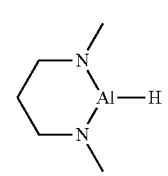 (IIg-1)

-continued (IIg-2) 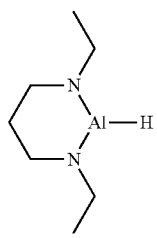

(IIg-3) 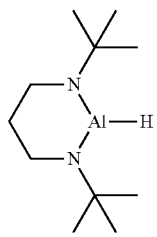

(IIg-4) 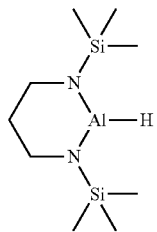

(IIh-1) 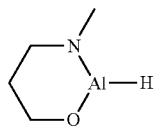

(IIh-2) 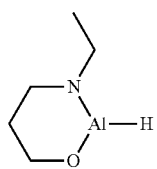

(IIh-3) 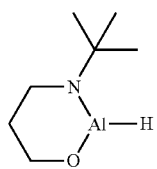

(IIh-4) 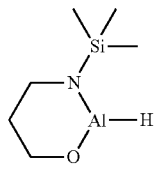

(IIi-1) 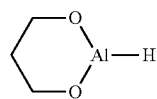

(IIi-2) 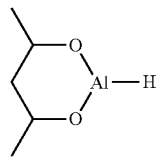

The compound of general formula (I) or (II) often form dimers in the liquid and solid phase, and sometimes also at least partially in the gaseous phase. These dimers are within the scope of the present invention.

According to the present invention, if n is 2 and E is NR or A is OR, at least one R in NR or OR bears no hydrogen atom in the 1-position, preferably independent of n if E is NR or A is OR, at least one R in NR or OR bears no hydrogen atom in the 1-position, more preferably all R in NR or OR bear no hydrogen atom in the 1-position, i.e. R bears no hydrogen atom which is bonded to the atom which is bonded to the nitrogen or oxygen atom, which is thus in the beta-position with regard to the aluminum atom. Examples are alkyl group bearing two alkyl side groups in the 1-position, i.e. 1,1-dialkylalkyl, such as tert-butyl, 1,1-dimethylpropyl; alkyl groups with two halogens in the 1-position such as trifluoromethyl, trichloromethyl, 1,1-difluoroethyl; trialkylsilyl groups such as trimethylsilyl, triethylsilyl, dimethyl-tert-butylsilyl; aryl groups, in particular phenyl or alkyl-substituted phenyl such as 2,6-diisopropylphenyl, 2,4,6-triisopropylphenyl. Alkyl groups bearing no hydrogen atom in the 1-position are particularly preferred.

The compound of general formula (I) or (II) preferably has a molecular weight of not more than 1000 g/mol, more preferably not more than 800 g/mol, even more preferably not more than 600 g/mol, in particular not more than 500 g/mol.

Preferably, the compound of general formula (I) or (II) has a melting point ranging from −80 to 125° C., preferably from −60 to 80° C., even more preferably from −40 to 50° C., in particular from −20 to 20° C. It is advantageous if the compound of general formula (I) or (II) melts to give a clear liquid which remains unchanged until a decomposition temperature.

Preferably, the compound of general formula (I) or (II) has a decomposition temperature of at least 80° C., more preferably at least 100° C., in particular at least 120° C., such as at least 150° C. Often, the decomposition temperature is not more than 250° C. The compound of general formula (I) or (II) has a high vapor pressure. Preferably, the vapor pressure is at least 1 mbar at a temperature of 200° C., more preferably at 150° C., in particular at 120° C. Usually, the temperature at which the vapor pressure is 1 mbar is at least 50° C.

The compound of general formula (I) or (II) can be synthesized by reacting the organic ligand with $AlH_3$, $LiAlH_4$ or $AlH_3(N(CH_3)_3)$, preferably in a liquid hydrocarbon or an ether. Hydrocarbons include aromatic hydrocarbons such as toluene, ethylbenzene, xylene and cumene; and aliphatic hydrocarbons such as cyclohexane, hexane, methylcyclohexane and heptane. Examples of ethers include diethyl ether, dimethyl ether, tetrahydrofuran, and mono-, di-, tri- and tetra-ethylene glycol dimethyl ether, preferably diethyl ether.

Ligands including their synthesis are for example disclosed for the compound of general formula (Ib) in US 2002/013487 A1; for (Ic) by Underhill et al. in the Journal of the American Chemical Society, volume 71 (1949), page 4014-4019; for (Id) by Heaton et al. in the Journal of the Chemical Society, Dalton Transactions: Inorganic Chemistry (1972-1999), 1996, page 61-68; for (Ie) and (Ii) by Popr et al in the Journal of Organic Chemistry, volume 10 (2014), page 1390-1396; for (If) by Afonso et al. in Molecules, volume 11 (2006), page 91-102; for (Ig) by Rosenau et al. in Synthetic Communications, volume 32 (2002), pages 457-466; for (Ih) by Spasyuk et al. in Organometallics, volume 31 (2012), page 5239-5242; for (Ii) in WO 2016/177655 A1; for (IIk) in US 2010/063294 A1; for (Im) in US 2010/069681; for (IIa) in WO 2010/019844 A1; for (IIb) by Cheng et al. in the Journal of Chemical Research, 1983, page 1101-1113; for (IId) Cortes et al. in the Journal of Organic Chemistry, volume 48 (1983), page 2246-2254; for (IIe) by Ram et al. in Synthetic Communications, volume 17 (1987), page 415-418; for (IIg) by Dale et al. in Acta Chemica Scandinavica, volume 45 (1991), page 1064-1070; for (IIh) in WO 2006/051851 A1; for (IIi) in CN 105585445 A.

The compound of general formula (I) or (II) used in the process according to the present invention are used at high purity to achieve the best results. High purity means that the substance used contains at least 90 wt.-% metal-containing compound or compound of general formula (I) or (II), preferably at least 95 wt.-%, more preferably at least 98 wt.-%, in particular at least 99 wt.-%. The purity can be determined by elemental analysis according to DIN 51721 (Prüfung fester Brennstoffe-Bestimmung des Gehaltes an Kohlenstoff and Wasserstoff-Verfahren nach Radmacher-Hoverath, August 2001).

The compound of general formula (I) or (II) is brought in contact with the solid substrate from the gaseous state. It can be brought into the gaseous state for example by heating them to elevated temperatures. In any case a temperature below the decomposition temperature of the compound of general formula (I) or (II) has to be chosen. The decomposition temperature is the temperature at which the pristine compound of general formula (I) or (II) begins changing its chemical structure and composition. Preferably, the heating temperature ranges from 0° C. to 300° C., more preferably from 10° C. to 250° C., even more preferably from 20° C. to 200° C., in particular from 30° C. to 150° C.

Another way of bringing the compound of general formula (I) or (II) into the gaseous state is direct liquid injection (DLI) as described for example in US 2009/0226612 A1. In this method the compound of general formula (I) or (II) is typically dissolved in a solvent and sprayed in a carrier gas or vacuum. If the vapor pressure of the compound of general formula (I) or (II) and the temperature are sufficiently high and the pressure is sufficiently low the compound of general formula (I) or (II) is brought into the gaseous state. Various solvents can be used provided that the compound of general formula (I) or (II) shows sufficient solubility in that solvent such as at least 1 g/l, preferably at least 10 g/l, more preferably at least 100 g/l. Examples for these solvents are coordinating solvents such as tetrahydrofuran, dioxane, diethoxyethane, pyridine or non-coordinating solvents such as hexane, heptane, benzene, toluene, or xylene. Solvent mixtures are also suitable.

Alternatively, the compound of general formula (I) or (II) can be brought into the gaseous state by direct liquid evaporation (DLE) as described for example by J. Yang et al. (Journal of Materials Chemistry, 2015). In this method, the compound of general formula (I) or (II) is mixed with a solvent, for example a hydrocarbon such as tetradecane, and heated below the boiling point of the solvent. By evaporation of the solvent, the compound of general formula (I) or (II) is brought into the gaseous state. This method has the advantage that no particulate contaminants are formed on the surface.

It is preferred to bring the compound of general formula (I) or (II) into the gaseous state at decreased pressure. In this way, the process can usually be performed at lower heating temperatures leading to decreased decomposition of the compound of general formula (I) or (II). It is also possible to use increased pressure to push the compound of general formula (I) or (II) in the gaseous state towards the solid substrate. Often, an inert gas, such as nitrogen or argon, is used as carrier gas for this purpose. Preferably, the pressure is 10 bar to $10^{-7}$ mbar, more preferably 1 bar to $10^{-3}$ mbar, in particular 1 to 0.01 mbar, such as 0.1 mbar.

Preferably, the compound of general formula (I) or (II) acts as reducing agent in the process. In this case, a metal-containing compound is deposited from the gaseous state onto the solid substrate before bringing it in contact with a compound of general formula (I) or (II). The metal-containing compound is usually reduced to a metal, a metal nitride, a metal carbide, a metal carbonitride, a metal alloy, an intermetallic compound or mixtures thereof. Metal films in the context of the present invention are metal-containing films with high electrical conductivity, usually at least $10^4$ S/m, preferably at least $10^5$ S/m, in particular at least $10^6$ S/m.

The compound of general formula (I) or (II) has a low tendency to form a permanent bond with the surface of the solid substrate with the deposited metal-containing compound. As a result, the metal-containing film hardly gets contaminated with the reaction by-products of the compound of general formula (I) or (II). Preferably, the metal-containing film contains in sum less than 5 weight-% nitrogen, more preferably less than 1 wt.-%, in particular less than 0.5 wt.-%, such as less than 0.2 wt.-%.

The metal-containing compound contains at least one metal atom. Metals include Li, Be, Na, Mg, Al, K, Ca, Sc, Ti, V, Cr, Mn, Fe, Co, Ni, Cu, Zn, Ga, Rb, Sr, Y, Zr, Nb, Mo, Tc, Ru, Rh, Pd, Ag, Cd, In, Sn, Sb, Te, Cs, Ba, La, Ce, Pr, Nd, Pm, Sm, Eu, Gd, Tb, Dy, Ho, Er, Tm, Yb, Lu, Hf, Ta, W, Re, Os Ir, Pt, Au, Hg, Tl, Pb, Bi. As the process according to the present invention is very versatile with regard to the metal-containing compound, the metal-containing compound can contain a metal which is more electropositive than Cu, more preferably more electropositive than Ni. In particular, the metal-containing compound contains Ti, Ta, Mn, Mo, W, Al, Co, Ge, Ga, Sb, or Te. It is possible that more than one metal-containing compound is deposited on the surface, either simultaneously or consecutively. If more than one metal-containing compound is deposited on a solid substrate it is possible that all metal-containing compounds contain the same metal or different ones, preferably they contain different metals.

Any metal-containing compound, which can be brought into the gaseous state, is suitable. These compounds include metal alkyls such as dimethyl zinc, trimethylaluminum; metal alkoxylates such as tetramethoxy silicon, tetra-iso-propoxy zirconium or tetra-iso-propoxy titanium; metal cyclopentadienyl complexes like pentamethylcyclopendienyl-trimethoxy titanium or di(ethylcycopentadienyl) manganese; metal carbenes such as tris(neopentyl) neopentylidene tantalum or bisimidazolidinyliden ruthenium chloride; metal halides such as aluminum trichloride, tantalum pentachloride, titanium tetrachloride, molybdenum pentachloride, or tungsten hexachloride; carbon monoxide complexes like hexacarbonyl chromium or tetracarbonyl nickel;

amine-derived complexes such as bis(tert-butylimino)bis(dimethylamido)molybdenum, bis(tert-butylimino)bis(dimethylamido)tungsten or tetrakis(dimethylamido)titanium; diketonate complexes such as tris(acetylacetonato)aluminum or bis(2,2,6,6-tetramethyl-3,5-heptanedionato) manganese.

Further examples for metal-containing compounds are aluminum tris(2,2,6,6-tetramethyl-3,5-heptanedionate), triisobutylaluminum, trimethylaluminum, tris(dimethylamido) aluminum(III), triethylgallium, trimethylgallium, tris(dimethylamido)gallium(III), tetrakis(diethylamido)titanium (IV), tetrakis(dimethylamido)titanium(IV), tetrakis (ethylmethylamido)titanium(IV), titanium (IV) diisopropoxidebis(2,2,6,6-tetramethyl-3,5-heptanedionate), titanium(IV) isopropoxide, titanium tetrachloride, bis(cyclopentadienyl)vanadium(II), bis(ethylcyclopentadienyl)vanadium(II), vanadium(V) oxytriisopropoxide, bis(cyclopentadienyl)chromium(II), bis(pentamethylcyclopentadienyl)chromium(II), chromium(III) tris(2,2,6,6-tetramethyl-3,5-heptanedionate), copper bis(6,6,7,7,8,8,8-heptafluoror-2,2-dimethyl-3,5-octanedionate), copper bis(2,2,6,6-tetramethyl-3,5-heptanedionate), bis(pentamethylcyclopentadienyl)manganese(II), bromopentacarbonylmanganese(I), cyclopentadienylmanganese(I) tricarbonyl, ethylcyclopentadienylmanagenese(I) tricarbonyl, managnese(0) carbonyl, [1,1'-bis(diphenylphosphino)ferrocene]tetracarbonylmolyb-denum(0), bis (pentamethylcyclopentadienyl)iron(II), 1,1'-diethylferrocene, iron(III) tris(2,2,6,6-tetramethyl-3,5-heptanedionate), iron(0) pentacarbonyl, bis(cyclopentadienyl)cobalt(II), bis(ethylcyclopentadienyl)cobalt(II), bis(pentamethylcyclopentadienyl)cobalt(II), allyl(cyclopentadienyl)nickel(II), bis(cyclopentadienyl)nickel (II), bis(ethylcyclopentadienyl)nickel(II), bis(triphenylphosphine)nickel(II) dichloride, nickel(II) bis(2,2,6,6-tetramethyl-3,5-heptanedionate), tris[N,N-bis(trimethylsilyl)amide]yttrium, tris(butylcyclopentadienyl) yttrium(III), tris(cyclopentadienyl)yttrium(III), yttrium(III) tris(isopropoxide), yttrium(III) tris(2,2,6,6-tetramethyl-3,5-heptanedionate), bis(cyclopentadienyl)niobium(IV) dichloride, bis(cyclopentadienyl)zirconium(IV) dihydride, dimethylbis(pentamethylcyclopentadienyl)zirconium(IV), tetrakis(diethylamido)zirconium(IV), tetrakis(dimethylamido)zirconium(IV), tetrakis(ethylmethylamido)zirconium (IV), zirconium(IV) 2-ethylhexanoate, zirconium tetrakis(2,2,6,6-tetramethyl-3,5-heptanedionate), bis (terbutylcyclopentadienyl) dimethylhafnium(IV), bis(trimethylsilyl)amidohafnium(IV) chloride, dimethylbis(cyclopentadienyl)hafnium(IV), hafnium(IV) tert-butoxide, tetrakis(diethylamido)hafnium(IV), tetrakis(dimethylamido)hafnium(IV), tetrakis(etmhylmethylamido)hafnium (IV), pentakis(dimethylamino)tantalum(V), tantalum(V) ethoxide, tris(diethylamido)(tert-butylimido)tantalum(V), bis(butylcyclopentadienyl)tungsten(IV) diiodide, bis(tert-butylimino)bis(tenbutylamino) tungsten, bis(tert-butylimino)bis(dimethylamino)tungsten(VI), bis(cyclopentadienyl)tungsten(IV) dichloride, bis(cyclopentadienyl)tungsten (IV) dihydride, bis(isopropylcyclopentadienyl)tungsten(IV) dihydride, cyclopentadienyltungsten(II) tricarbonyl hydride, tetracarbonyl(1,5-cyclooctadiene)tungsten(0), and triamminetungsten(IV) tricarbonyl, tungsten hexacarbonyl, bis(pentafluorophenyl)zinc, bis(2,2,6,6-tetramethyl-3,5-heptanedionato)zinc(II), diethylzinc, diphenylzinc, trimethyl (methylcyclopentadienyl)platinum(IV), triethyl (methylcyclopentadienyl)platinum(IV), bis (cyclopentadienyl)magnesium(II), bis (pentamethylcyclopentadienyl)magnesium, (3-aminopropyl)triethoxysilane, N-sec-butyl(trimethylsilyl) amine, chloropentamethyldisilane, 1,2-dichlorotetramethyldisilane, 1,3-diethyl-1,1,3,3-tetarmethyldisilazane, 1,2-dimethyl-1,1,2,2-tetraphenyldisilane, dodecamethylcyclohexasilane, hexamethyldisilane, hexamethyldisilazane, methylsilane, 2,4,6,8,10-pentamethylcyclopentasiloxane, pentamethyldisilane, silicon tetrabromide, silicon tetrachloride, tetraethylsilane, 2,4,6,8-tetramethylcyclotetrasiloxane, 1,1,2,2-tetramethyldisilane, tris(tert-butoxy)silanol, tris(tert-pentoxy)silanol, germanium(IV) fluoride, hexamethyldigermanium(IV), hexaphenyldigermanium(IV), tetramethylgermanium, tributylgermanium hydride, triphenylgermanium hydride, bis[bis(trimethylsilyl)amino]tin(II), dibutyldiphenyltin, hexaphenylditin(IV), tetraallyltin, tetrakis(diethylamido)tin (IV), tetrakis(dimethylamido)tin(IV), tetramethyltin, tetravinyltin, tin(II) acetylactonate, trimethyl(phenylethylnyl) tin, and trimethyl(phenyl)tin, tri(ethyloxy)antimony(III), tri (butyloxy)antimony(III), $((CH_3)_2N)_3SbGe(OC_2H_5)_4$, tetramethylgermanium(IV), tetraethylgermanium(IV), tetra-n-butylgermanium(IV).

Metal halides are preferred, metal chlorides are more preferred, in particular $TiCl_4$, $TaCl_5$, $MoCl_5$, $WCl_5$, $WCl_6$, $AlCl_3$, $GaCl_3$, $GeCl_4$, $TeCl_4$. It is preferred that the molecular weight of the metal-containing compound is up to 1000 g/mol, more preferred up to 800 g/mol, in particular up to 600 g/mol, such as up to 500 g/mol.

The process is preferably performed as atomic layer deposition (ALD) process comprising the sequence
(a) depositing a metal-containing compound from the gaseous state onto a solid substrate and
(b) bringing the solid substrate with the deposited metal-containing compound in contact with a compound of general formula (I) or (II). Preferably, the sequence comprising (a) and (b) is performed at least twice, more preferably at least five times, even more preferably at least 10 times, in particular at least 50 times. Often, the sequence comprising (a) and (b) is performed not more than 1000 times.

Generally, it is preferred to purge the substrate and its surrounding apparatus with an inert gas each time the solid substrate is exposed to the metal-containing compound or the compound of general formula (I) or (II) in the gaseous state. Preferred examples for inert gases are nitrogen and argon. Purging can take 1 s to 1 min, preferably 5 to 30 s, more preferably from 10 to 25 s, in particular 15 to 20 s.

Preferably, the temperature of the substrate is 5° C. to 40° C. higher than the place where the metal-containing compound is brought into the gaseous state, for example 20° C. Preferably, the temperature of the substrate is from room temperature to 450° C., more preferably from 100 to 400° C., in particular from 120 to 300° C., such as 150 to 220° C.

Preferably, after deposition of a metal-containing compound on the solid substrate and before bringing the solid substrate with the deposited metal-containing compound in contact with the compound of general formula (I) or (II), the solid substrate with the deposited metal-containing compound is brought in contact with an acid in the gaseous phase. Without being bound by a theory, it is believed that the protonation of the ligands of the metal-containing compound facilitates its decomposition and reduction. Suitable acids include hydrochloric acid and carboxylic acids, preferably, carboxylic acids such as formic acid, acetic acid, propionic acid, butyric acid, or trifluoroacetic acid, in particular formic acid.

An example for the process of the present invention is a method of depositing a metal-containing film on a substrate, comprising:
(i) supplying a metal precursor vapor to a substrate to obtain a coated substrate;
(ii) purging the coated substrate with a first carrier gas;
(iii) supplying an aluminum hydride co-reactant to the coated substrate; and then
(iv) purging with a second carrier gas, wherein the aluminum hydride co-reactant is a metal complex, comprising an aluminum hydride comprising 1 to 3 hydrogen atoms bonded to aluminum, and wherein (i) to (iv) are optionally repeated one or more times. A metal precursor generally is a metal-containing compound. The aluminum hydride co-reactant is a compound of general formula (I) or (II), preferably a compound of general formula (I), more preferably a compound of general formula (Ia), even more preferably a compound of general formula (Ia) wherein R' is hydrogen, in particular a compound of general formula (Ia) wherein R' is hydrogen and R is methyl.

Alternatively, the process according to the present invention can serve to deposit aluminum from the compound of general formula (I) or (II). In this case, the compound of general formula (I) or (II) adsorbs to the surface of the solid substrate, for example because there are reactive groups such as OH groups on the surface of the solid substrate or the temperature of the solid substrate is sufficiently high. Preferably the adsorbed compound of general formula (I) or (II) is decomposed.

The decomposition can be effected in various ways. The temperature of the solid substrate can be increased above the decomposition temperature. In this case, the process is a chemical vapor deposition (CVD) process. Typically, the solid substrate is heated to a temperature in the range of 300 to 1000° C., preferably in the range of 350 to 600° C.

Furthermore, it is possible to expose the deposited compound of general formula (I) or (II) to a plasma like an oxygen plasma, hydrogen plasma, ammonia plasma, or nitrogen plasma; to oxidants like oxygen, oxygen radicals, ozone, nitrous oxide ($N_2O$), nitric oxide (NO), nitrogendioxde ($NO_2$) or hydrogenperoxide; to ammonia or ammonia derivatives for example tert-butylamine, iso-propylamine, dimethylamine, methylethylamine, or diethylamine; to hydrazine or hydrazine derivatives like N,N-dimethylhydrazine; to solvents like water, alkanes, or tetrachlorocarbon; or to boron compound like borane. The choice depends on the chemical structure of the desired layer. For aluminum oxide, it is preferable to use oxidants, plasma or water, in particular oxygen, water, oxygen plasma or ozone. For aluminum, nitride, ammonia, hydrazine, hydrazine derivatives, nitrogen plasma or ammonia plasma are preferred. For aluminum boride boron compounds are preferred. For aluminum carbide, alkanes or tetrachlorocarbon are preferred. For aluminum carbide nitride, mixtures including alkanes, tetrachlorocarbon, ammonia and/or hydrazine are preferred.

The process is preferably performed as atomic layer deposition (ALD) process comprising the sequence
(c) bringing a solid substrate in contact with a compound of general formula (I) or (II) and
(d) decomposing the adsorbed compound of general formula (I) or (II). Preferably, the sequence comprising (c) and (d) is performed at least twice, more preferably at least five times, even more preferably at least 10 times, in particular at least 50 times. Often, the sequence comprising (c) and (d) is performed not more than 1000 times.

In this case the temperature of the substrate is preferably 5° C. to 40° C. higher than the place where the metal-containing compound is brought into the gaseous state, for example 20° C.

Preferably, the temperature of the substrate is from room temperature to 450° C., more preferably from 100 to 400° C., in particular from 120 to 300° C., such as 150 to 220° C.

If the temperature of the substrate in the process according to the present invention is kept below the decomposition temperature of the metal-containing compound, typically a monolayer is deposited on the solid substrate. Once a molecule of the metal-containing compound is deposited on the solid substrate further deposition on top of it usually becomes less likely. Thus, the deposition of the metal-containing compound on the solid substrate preferably represents a self-limiting process step. The typical layer thickness of a self-limiting deposition processes step is from 0.01 to 1 nm, preferably from 0.02 to 0.5 nm, more preferably from 0.03 to 0.4 nm, in particular from 0.05 to 0.2 nm. The layer thickness is typically measured by ellipsometry as described in PAS 1022 DE (Referenzverfahren zur Bestimmung von optischen und dielektrischen Materialeigenschaften sowie der Schichtdicke dünner Schichten mittels Ellipsometrie; February 2004).

The exposure of the substrate with the compound of general formula (I) or (II) or the metal-containing compound can take from milliseconds to several minutes, preferably from 0.1 second to 1 minute, in particular from 1 to 10 seconds. The longer the solid substrate at a temperature below the decomposition temperature of the compound of general formula (I) or (II) or the metal-containing compound is exposed to the compound of general formula (I) or (II) or the metal-containing compound the more regular films formed with less defects.

A particular advantage of the process according to the present invention is that the compound of general formula (I) or (II) is very versatile, so the process parameters can be varied in a broad range. Therefore, the process according to the present invention includes both a CVD process as well as an ALD process.

The process according to the present invention yields an inorganic metal-containing film. A film can be only one monolayer of a metal or be thicker such as 0.1 nm to 1 μm, preferably 0.5 to 50 nm. A film can contain defects like holes. These defects, however, generally constitute less than half of the surface area covered by the film. The film preferably has a very uniform film thickness which means that the film thickness at different places on the substrate varies very little, usually less than 10%, preferably less than 5%. Furthermore, the film is preferably a conformal film on the surface of the substrate. Suitable methods to determine the film thickness and uniformity are SEM/TEM or ellipsometry.

The film obtained by the process according to the present invention can be used in an electronic element. Electronic elements can have structural features of various sizes, for example from 1 nm to 100 μm, for example 10 nm, 14 nm or 22 nm. The process for forming the films for the electronic elements is particularly well suited for very fine structures. Therefore, electronic elements with sizes below 1 μm are preferred. Examples for electronic elements are field-effect transistors (FET), solar cells, light emitting diodes, sensors, or capacitors. In optical devices such as light emitting diodes or light sensors the film obtained by the process according to the present invention serves to increase the refractive index of the layer which reflects light.

Preferred electronic elements are transistors. Preferably the film acts as chemical barrier metal in a transistor. A chemical barrier metal is a material which reduces diffusion of adjacent layers while maintaining electrical connectivity.

Alternatively, in the process described herein a compound of general formula (III) or (IV) can be used instead of the compound of general formula (I) or (II). The same definitions and preferred embodiments for R and R' and the rest of the process as described above apply.

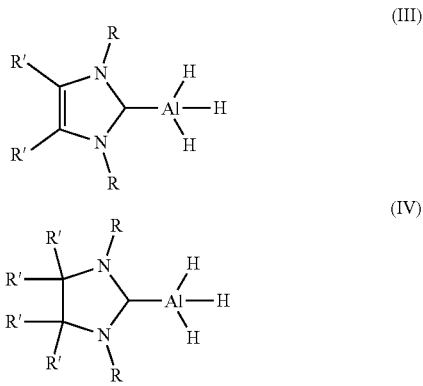

(III)

(IV)

Examples of the compound of general formula (III) are the following.

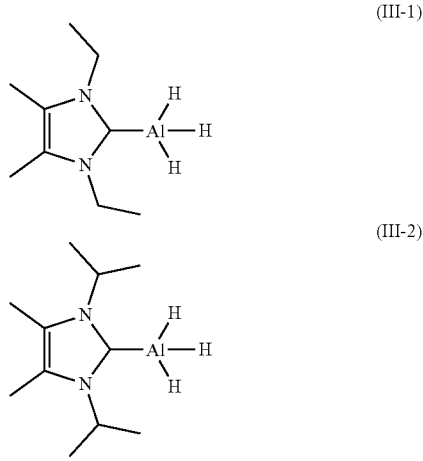

(III-1)

(III-2)

BRIEF DESCRIPTION OF THE FIGURES

FIG. 3 top right demonstrates the growth rate and resistivity versus pulse length of $TiCl_4$. FIG. 3 lower left demonstrates the growth rate and resistivity versus temperature. FIG. 3 lower right demonstrates the film thickness versus number of cycles.

EXAMPLES

Example 1a

Figure 1:
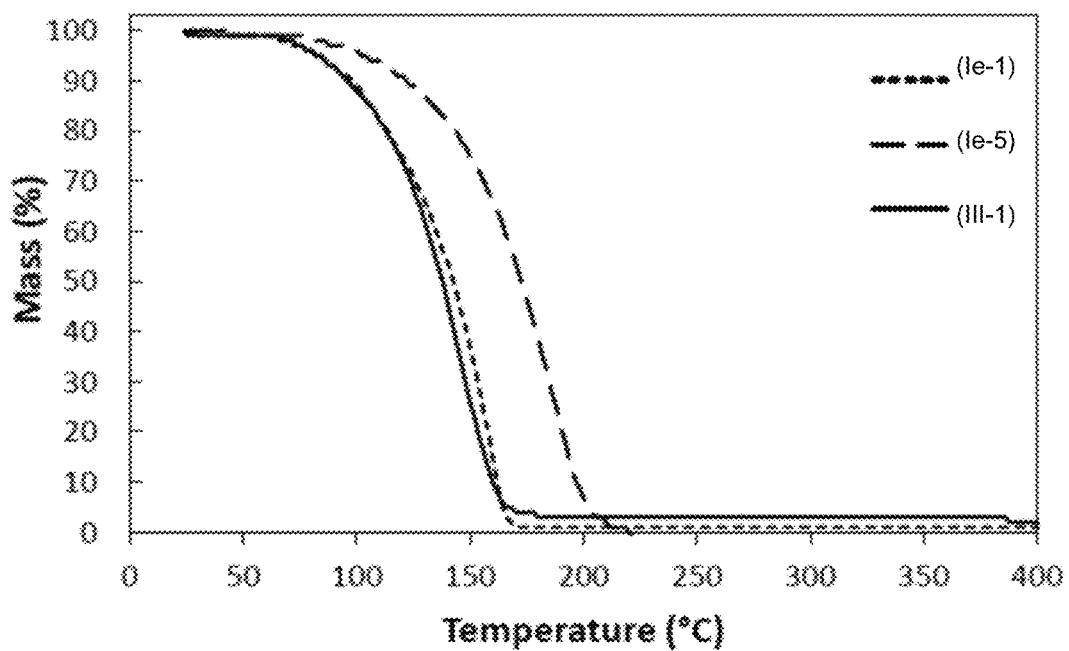
FIG. 1 shows the thermogravimetric analyses (TGA) of compound (Ie-1), (Ie-5) and (III-1).
Figure 2:
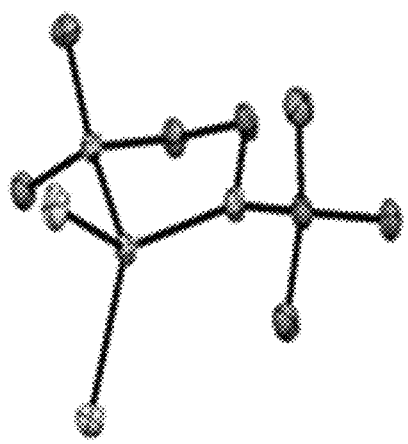
FIG. 2 shows the X-ray crystal structure of compound (Ie-5).

Synthesis of the Ligand of Compound (Ie-1)

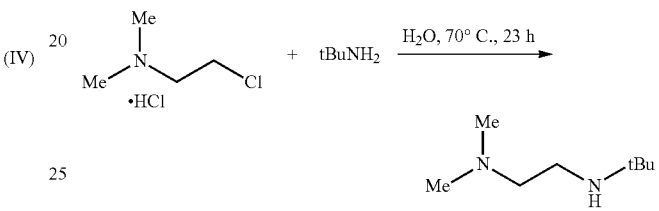

A 250 mL round-bottomed flask was charged with 2-chloro-N,N-dimethylethylamine hydrochloride (25.0 g, 0.175 mol), tert-butylamine (115 mL, 1.1 mol, 6. 3 equiv.), water (5 mL), and heated to gentle reflux at 70° C. for 18 h. After cooling to ambient temperature, hexanes and water (40 mL each) were added and transferred to a separatory funnel. The aqueous fraction was washed with hexanes (3×20 mL) and the combined hexanes fractions were washed with brine, dried over $MgSO_4$, and evaporated under reduced pressure to yield a clear, colorless oil. (10.898 g, 43%) The analytically pure product was used routinely without further purification, but it can be purified by vacuum distillation at 65° C., 18 Torr.

$^1$H NMR (400 MHz, $C_6D_6$) δ=2.56 (t, 2H), 2.34 (t, 2H), 2.06 (s, 6H), 1.29 (bs, 1H), 1.06 (s, 9H) $^{13}$C NMR (100 MHz, C6D$_6$) δ=60.52, 50.00, 45.74, 40.53, 29.61

Example 1b

Synthesis of Compound (Ie-1)

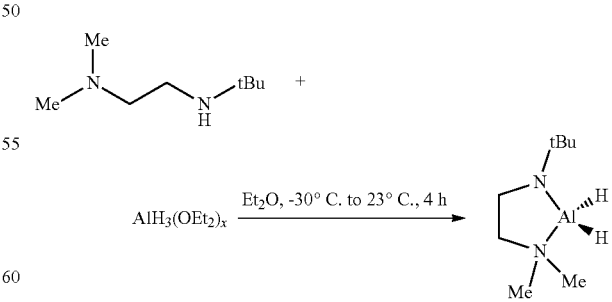

A 250 mL Schlenk flask was charged with $LiAlH_4$ (0.854 g, 22.5 mmol), diethyl ether (70 mL), and cooled to 0° C. on an ice bath. A separate 100 mL Schlenk flask was charged with $AlCl_3$ (1.000 g, 7.5 mmol) and diethyl ether (50 mL). The $AlCl_3$ solution was cannulated into the $LiAlH_4$ solution and the resulting cloudy solution stirred at ambient temperature for 30 min. The mixture was cooled to −30° C. and a solution of 1-tert-butylamino-2-dimethylaminoethane (3.934 g, 27.3 mmol) in diethyl ether (25 mL) was added. The resulting mixture stirred at ambient temperature over 4 h and was then filtered through Celite and evaporated under reduced pressure. When most of the diethyl ether had been evaporated, the flask was cooled on an ice bath to solidify the low-melting product (3.345 g, 71%). M.P.: 31-32° C.

¹H NMR (600 MHz, C$_6$D$_6$) δ=4.52 (bs, 2H), 2.73 (t, 2H), 2.15 (t, 2H), 1.83 (s, 6H), 1.35 (s, 9H) ¹³C NMR (150 MHz, C$_6$D$_6$) δ=61.62, 51.25, 44.83, 41.73, 30.52 IR (ATR) v/cm$^{-1}$=3001, 2961, 2895, 2853, 2812, 1852, 1782, 1728, 1485, 1462, 1429, 1406, 1383, 1352, 1342, 1290, 1238, 1223, 1205, 1184, 1157, 1118, 1101, 1065, 1057, 1014, 1003, 947, 916, 895, 800, 775, 679, 619, 596, 580, 546, 511, 465

Cryoscopic Molecular Weight calcd. for C$_8$H$_{21}$AlN$_2$ 172.25 found 179.06, degree of association=1.04

Example 2a

Synthesis of the Ligand of Compound (Ie-5)

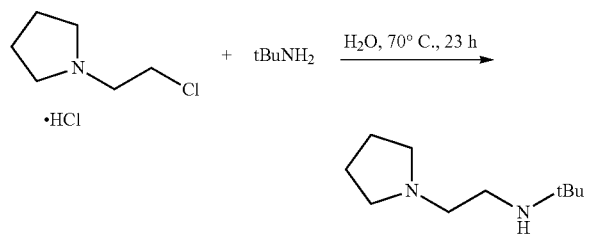

A 250 mL round-bottomed flask was charged with 1-(2-chloroethyl)pyrrolidine hydrochloride (24.85 g, 0.146 mol), tert-butylamine (115 mL, 1.1 mol, 6. 3 equiv.), water (5 mL), and heated to gentle reflux at 70° C. for 18 h. After cooling to ambient temperature, hexanes and water (40 mL each) were added and transferred to a separatory funnel. The aqueous fraction was washed with hexanes (3×20 mL) and the combined hexanes fractions were washed with brine, dried over MgSO$_4$, and evaporated under reduced pressure to yield a slightly red oil that was purified by vacuum distillation at 100° C. and 18 Torr. (14.466 g, 58.1%)

¹H NMR (400 MHz, C$_6$D$_6$) δ=2.67-2.56 (m, 4H), 2.39 (t, 4H), 1.59 (p, 4H), 1.07 (s, 9H) ¹³C NMR (100 MHz, C$_6$D$_6$) δ=57.40, 54.55, 50.08, 41.88, 29.64, 24.28

Example 2b

Synthesis of Compound (Ie-5)

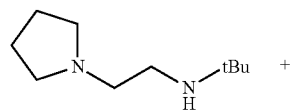

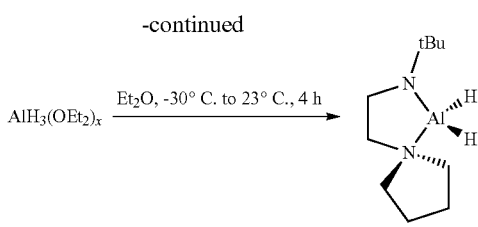

A 250 mL Schlenk flask was charged with LiAlH$_4$ (0.925 g, 24.37 mmol), diethyl ether (70 mL), and cooled to 0° C. on an ice bath. A separate 100 mL Schlenk flask was charged with AlCl$_3$ (1.083 g, 8.12 mmol) and diethyl ether (50 mL). The AlCl$_3$ solution was cannulated into the LiAlH$_4$ solution and the resulting cloudy solution stirred at ambient temperature for 30 min. The mixture was cooled to −30° C. and a solution of the ligand of compound (Ie-5) (5.531 g, 32.48 mmol) in diethyl ether (25 mL) was added. The resulting mixture stirred at ambient temperature over 4 h and was then filtered through Celite and evaporated under reduced pressure. When most of the diethyl ether had been evaporated, the flask was cooled on an ice bath to solidify the low-melting product (3.600 g, 56%).

M.P.: 28-29° C.

¹H NMR (600 MHz, C$_6$D$_6$) δ=4.47 (bs, 2H), 3.08 (m, 2H), 2.82 (t, 2H), 2.43 (t, 2H), 1.66 (m, 4H), 1.37 (s, 9H), 1.22 (m, 2H)

¹³C NMR (150 MHz, C$_6$D$_6$) δ=59.45, 54.84, 51.52, 42.99, 30.48, 23.23

Example 3

Synthesis of chlorinated analogue of Compound (Ie-1)

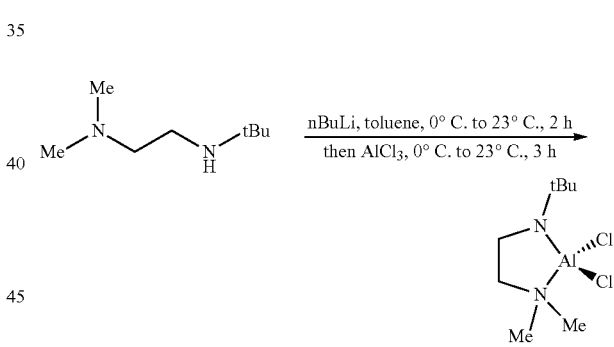

A 100 mL Schlenk flask was charged with 1-tert-butylamino-2-dimethylaminoethane (500 mg, 3.47 mmol), toluene (25 mL), and cooled to 0° C. on an ice bath. n-Butyllithium solution (1.39 mL, 3.47 mmol) was added dropwise and the mixture was allowed to stir on the ice bath for 30 min then the ice bath was removed and the mixture warmed to ambient temperature over 2 h. A separate 100 mL Schlenk flask was charged with AlCl$_3$ (463 mg, 3.47 mmol), toluene (15 mL), and cooled to 0° C. on an ice bath. The ligand solution was then cannulated into the AlCl$_3$ solution and the resulting mixture warmed slowly to ambient temperature over 3 h before being filtered through Celite and evaporated under reduced pressure to yield an orange solid. Sublimation of the crude (100° C., 50 mTorr) yielded colorless crystals (388 mg, 48%).

M.P.: 87-89° C.

¹H NMR (400 MHz, C$_6$D$_6$) δ=2.49 (t, 2H), 1.97 (t, 2H), 1.76 (s, 6 H), 1.27 (s, 9H)

¹³C NMR (100 MHz, C$_6$D$_6$) δ=60.20, 50.74, 44.92, 39.71, 30.41

Example 4

Synthesis of Compound (III-1)

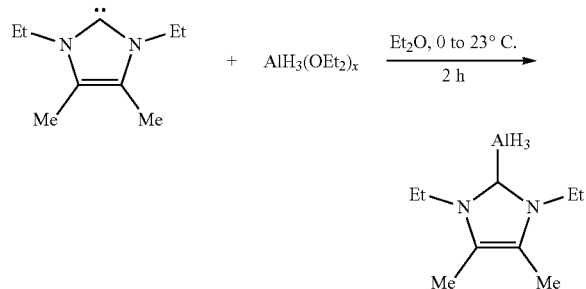

A 200 mL Schlenk flask was charged with $AlCl_3$ (481 mg, 3.605 mmol) and diethyl ether (40 mL) and cooled on an ice bath. A 100 mL Schlenk flask was charged with $LiAlH_4$ (410 mg, 10.815 mmol) and diethyl ether (40 mL) and the resulting $LiAlH_4$ solution was transferred by cannula to the $AlCl_3$ solution. The resulting diethyl ether solution of $AlH_3$ (14.421 mmol, 1.1 equiv.) was stirred at ambient temperature for 30 min. A separate 100 mL Schlenk flask was charged with 1,3-diethyl-4,5-dimethylimidazol-2-ylidene (1.996 g, 13.11 mmol), and diethyl ether (20 mL). This solution was then transferred by cannula to the $AlH_3$ solution that had been re-cooled on an ice bath. The resulting mixture stirred at ambient temperature for 18 h, then the mixture was filtered through Celite, the solids washed with diethyl ether (2×15 mL) and the combined diethyl ether fractions were evaporated under reduced pressure yielding a white powder. (1.960 g, 82%) Purified by sublimation at 110° C., 50 mTorr.

M.P.: 115-116° C.

$^1H$ NMR (600 MHz, $C_6D_6$) δ=3.82 (q, 4H), 1.26 (s, 6H), 1.01 (t, 6H)

$^{13}C$ NMR (150 MHz, $C_6D_6$) δ=124.97, 42.40, 16.61, 7.99

IR (ATR) v/cm$^{-1}$ =2967, 2924, 2872, 2818, 1767, 1720, 1639, 1470, 1447, 1420, 1396, 1379, 1356, 1344, 1315, 1298, 1242, 1205, 1159, 1118, 1094, 970, 903, 822, 741, 696, 586, 523, 498

Example 5

Titanium Carbonitride Film Growth from $TiCl_4$ and Compound (Ie-1)

ALD growth of thin films was evaluated using compound (Ie-1) and $TiCl_4$ on $SiO_2$ substrates (100 nm thermal oxide on Si) in a Picosun R-75 ALD reactor equipped with a load-lock and ultra-high purity $N_2$ (<100 ppt $H_2O$, $O_2$) as carrier gas. Precursor and co-reactant vapor was pulsed into the deposition chamber sequentially using inert gas valving and separated by purge periods.

Depositions at temperatures above 180° C. produced light gold colored films where were conductive and stable in air.

Self-limiting growth was demonstrated for both precursor and co-reacant at 300° C. by investigating growth rate as a function of precursor and co-reactant pulse length. The top of FIG. 3 demonstrate that growth rate was constant at 1.7 Å/cycle after 250 ALD cycles for pulse lengths ≥0.2 s for $TiCl_4$ and ≥2.0 s for compound (Ie-1). The observation of self-limiting behavior for compound (Ie-1) was unexpected and surprising, since the film growth temperature of 300° C. is well above its solid-state thermal decomposition temperature of 185° C. Above co-reactant decomposition temperatures, loss of self-limiting growth and increasing growth rate is usually observed. n this case, no film growth was observed in the absence of either precursor or co-reactant even up to 400° C.

Figure 3:
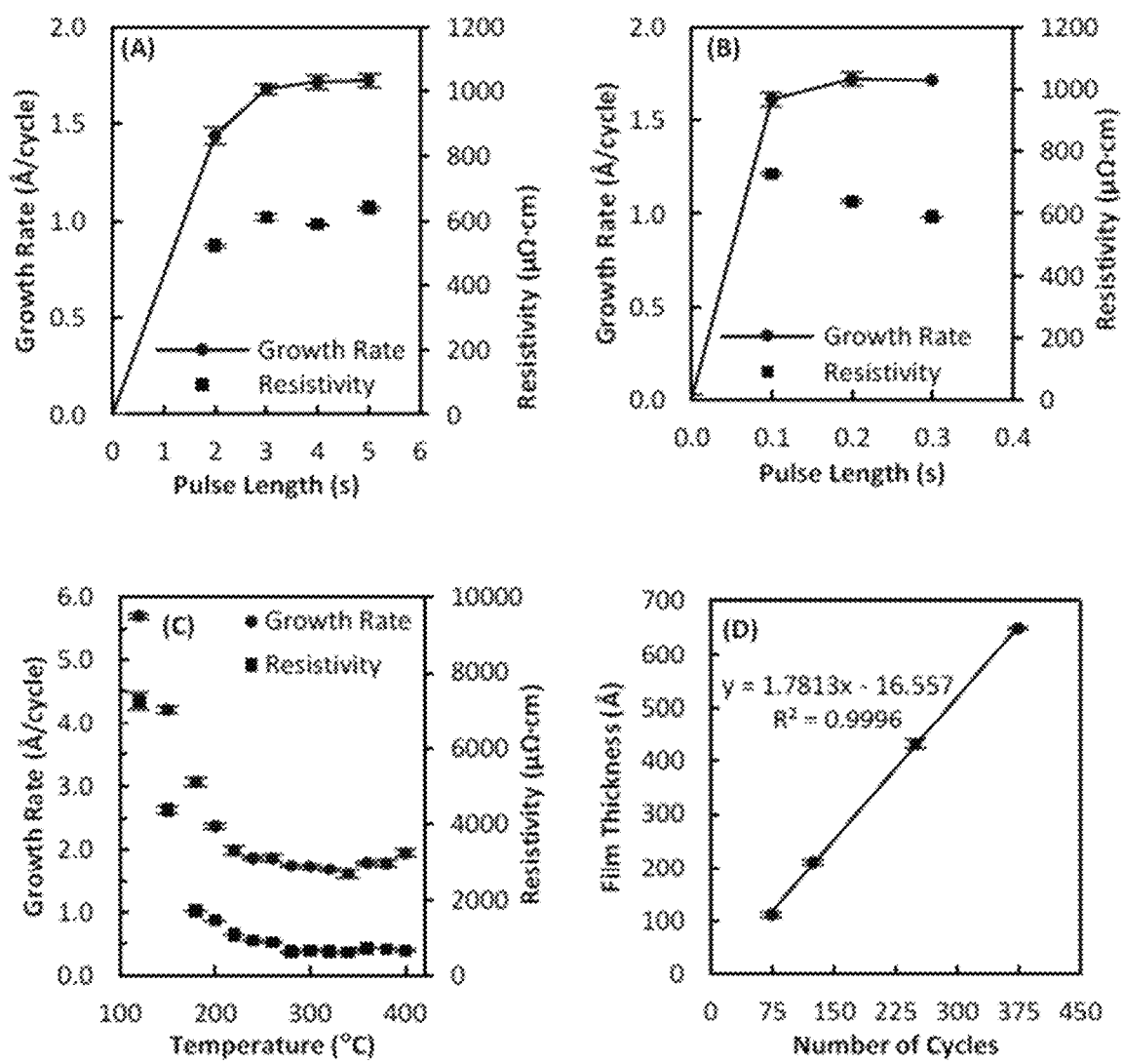
FIG. 3 top left demonstrates the growth rate and bulk resistivity versus pulse length of compound (Ie-1).

Using the saturative pulse scheme of 0.2 s $TiCl_4$, 5 s compound (Ie-1), and 10 s $N_2$ purges, growth rate after 250 cycles was evaluated as a function of substrate temperature, as demonstrated by FIG. 3 lower left. Between 220-400° C., growth rate was approximately independent of substrate temperature at 1.6-2.0 Å/cycle. Film resistivities were between 600-650 μΩ·cm across the temperature range 280-400° C. Linear film growth was observed between 75-375 cycles with a growth rate according to linear regression of 1.78 Å/cycle (FIG. 6D). The y-intercept of −16.577 could indicate a slight nucleation delay of about 9 cycles before steady-state growth is reached.

X-ray photoelectron spectroscopy (XPS) was used to determine film composition and revealed the presence of Ti, C, and N with small amounts of O, Cl, and Al as demonstrated in Table 2 below.

TABLE 2

| XPS film composition using $TiCl_4$ and compound (Ie-1) | | | | | |
|---|---|---|---|---|---|
| Temperature | Ti/at % | C/at % | N/at % | Al/at % | Cl/at % | O/at % |
| 300 | 38.9 | 29.0 | 21.0 | 3.7 | 3.9 | 3.5 |
| 400 | 29.5 | 31.6 | 23.5 | 6.1 | 2.5 | 6.9 |

Figure 4:
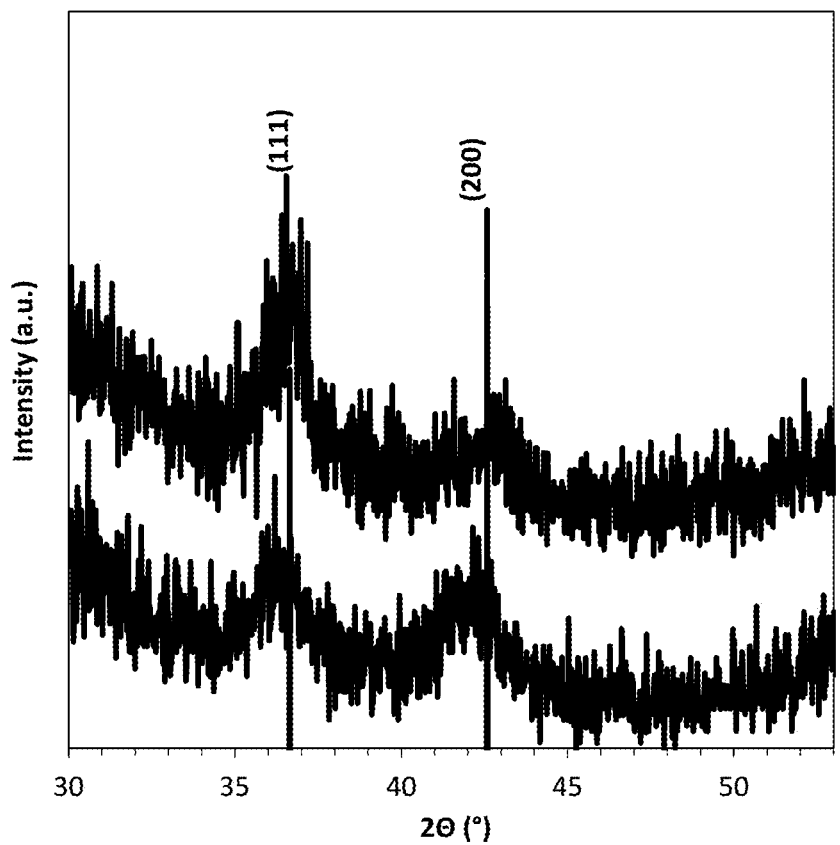
FIG. 4 shows the GI-XRD patterns of $TiC_xN_y$ films deposited at 280° C. (bottom) and 400° C. (top).

As demonstrated in FIG. 4, the structure of the films was found to be nanocrystalline TiN/TiC by grazing incidence XRD (GI-XRD) analysis of 40-50 nm films deposited at 280 and 400° C. Low intensity reflections were observed corresponding to the 111 and 200 lattice planes of TiN/TiC.

Example 6

Tungsten Carbide Film Growth from $WCl_6$ and Compound (Ie-1)

Figure 5:
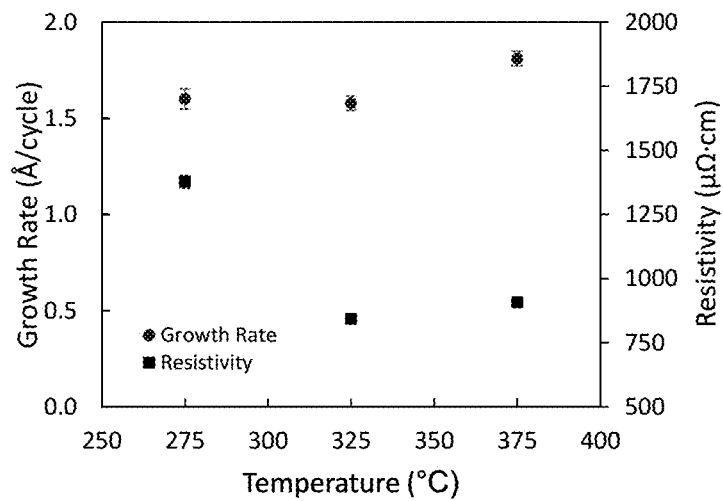
FIG. 5 demonstrates the growth rate and film resistivity versus temperature for films deposited from $WCl_6$ and compound (Ie-1) after 250 ALD cycles.

Initial ALD film growth trials using $WCl_6$ and compound (Ie-1) deposited silver-grey films with growth rates between 1.6-1.8 Å/cycle and resistivities between 850-1350 μΩ·cm at growth temperatures of 275-375° C. (FIG. 5). These results were similar to those obtained using $TiCl_4$ and compound (Ie-1). Film composition based on energy-dispersive X-ray spectroscopy (EDS) consisted of W and C with low Cl and Al content. No N was detected by EDS whereas a clear N signal was observed for films deposited from $TiCl_4$ and compound (Ie-1). Thus, these films are likely $WC_x$ and not $WC_xN_y$. It is possible that W metal films are formed at lower temperatures based on the easier reduction of W versus Ti.

Example 7

Aluminum Metal Film Growth from $AlCl_3$ and Compound (Ie-1)

Figure 6:
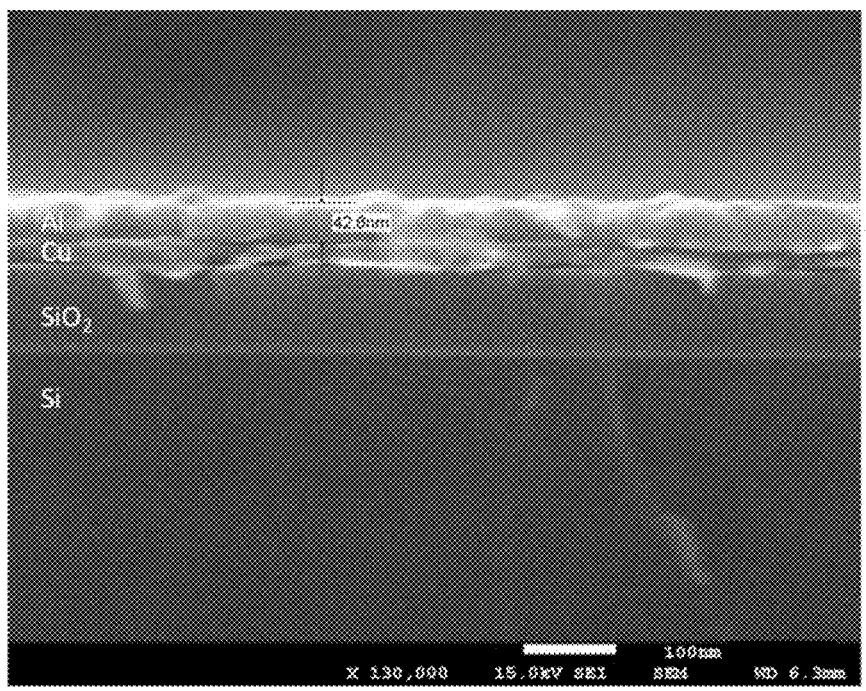
FIG. 6 shows the cross-sectional SEM image of a 42 nm Al film deposited on a Cu substrate at 120° C. after 125 ALD cycles of $AlCl_3$ and compound (Ie-1).

Using $AlCl_3$ as the metal precursor and with compound (Ie-1) as the reducing agent, Al metal films were deposited at 120° C. The pulse sequence was 2 s $AlCl_3$ pulse, 20 s $N_2$ purge, 5 s compound (Ie-1) pulse, 10 s $N_2$ purge for 125 cycles which deposited a 42 nm film on a Cu substrate (FIG. 6). The sheet resistivity was 1.56 Ω/square which corresponds to a calculated bulk resistivity of 6.5 μΩ·cm, close to the resistivity of bulk Al metal (2.74 μΩ·cm). After 250 cycles, 80 nm thick films deposited on Cu and TiN substrates had sheet resistivities of 0.65 Ω/square and bulk resistivities of 5.0 μΩ·cm.

Figure 7:
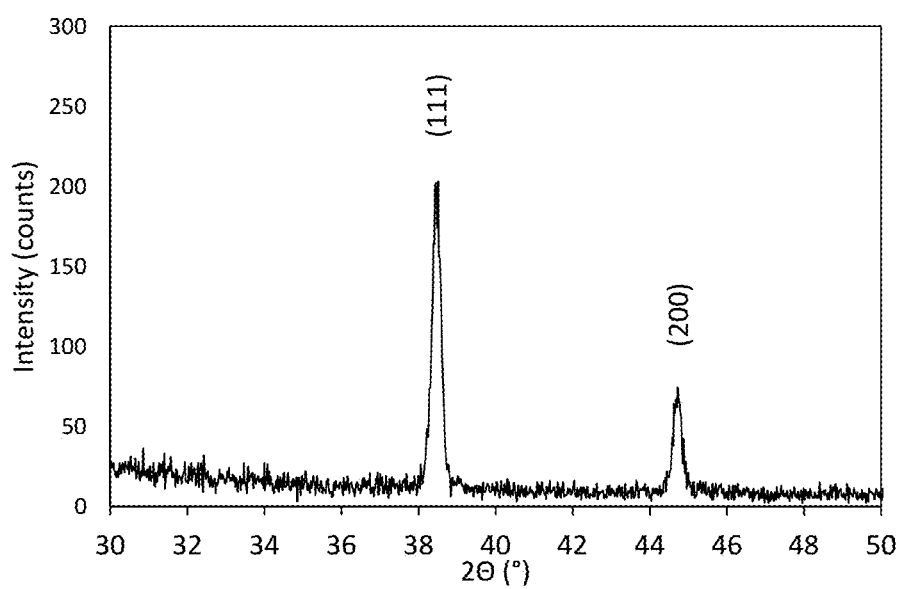
FIG. 7 demonstrates the GI-XRD pattern of a 400 nm thick Al film deposited on a thermal oxide (100 nm on Si) at 120° C. after 1000 ALD cycles.

The as-deposited films are crystalline Al metal according to GI-XRD. FIG. 7 shows the GI-XRD pattern of a 400 nm thick Al film deposited on an SiO$_2$ (100 nm thermal oxide on Si) substrate with typical 111 and 200 reflections of Al metal.

Example 8a

Synthesis of the Ligand of Compound (Ii-3)

A mixture of 3-dimethylaminopropyl chloride hydrochloride (10.046 g, 0.062 mol), tert-butylamine (30 mL, 0.280 mol), and water (5 mL) was refluxed for 18 h in a 100 mL round bottomed flask. Hexane (25 mL) and water (20 mL) were added to the resultant solution at ambient temperature. The flask contents were transferred to a separatory funnel. The aqueous fraction was washed with hexane (9×25 mL) and the combined organic fractions were dried over anhydrous MgSO$_4$. The solvent was evaporated under reduced pressure to yield a colorless oil (3.798 g, 39% yield).

$^1$H NMR (400 MHz, C$_6$D$_6$) δ=1.03 (s, 9H), 1.56 (pentet, 2H), 2.11 (s, 6H), 2.26 (t, 2H), 2.55 (t, 2H).

$^{13}$C NMR (100 MHz, C$_6$D$_6$) δ=29.69, 30.17, 41.48, 46.10, 50.32, 58.85.

Example 8b

Synthesis of Compound (Ii-3)

A solution of AlCl$_3$ (0.800 g, 6 mmol) in 30 mL of diethyl ether was cannulated into a stirred solution of LiAlH$_4$ (0.719 g, 18 mmol) in 45 mL of diethyl ether at 0° C. in an ice bath. The resultant cloudy solution was warmed to room temperature, stirred for 40 min and re-cooled to −30° C. Then, a solution of [3-(tert-butylamino)propyl]dimethylamine (3.798 g, 24 mmol) in 45 mL of diethyl ether was added dropwise. The resultant mixture was stirred at ambient temperature for 18 h and was then filtered through a 2-cm plug of Celite on a coarse glass frit. The diethyl ether was evaporated from the filtrate under reduced pressure to collect the white semi-solid. The crude product was purified by distillation around 60° C. under reduced pressure affording a colorless oil (1.301 g, 30% yield).

$^1$H NMR (400 MHz, C$_6$D$_6$) δ=1.27 (pentet, 2H), 1.30 (s, 9H), 1.95 (s, 6H), 2.08 (t, 2H), 2.99 (t, 2H).

$^{13}$C NMR (100 MHz, C$_6$D$_6$) δ=28.79, 31.77, 45.73, 45.82, 53.01, 62.02. IR: v$_{AlH}$/cm$^{-1}$ 1801.

The invention claimed is:

1. A process for preparing inorganic metal-containing films comprising bringing a solid substrate in contact with a compound of general formula (I) or (II) in the gaseous state

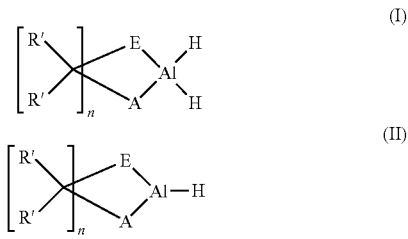

wherein A is NR$_2$ or OR with R being an alkyl group, an alkenyl group, an aryl group, or a silyl group,
E is NR or O,
n is 1, 2 or 3, and
R' is hydrogen, an alkyl group, an alkenyl group, an aryl group, or a silyl group, wherein if n is 2 and E is NR or A is OR, at least one R in NR or OR bears no hydrogen atom in the 1-position,
wherein a metal-containing compound is deposited from the gaseous state onto the solid substrate before bringing it in contact with a compound of general formula (I) or (II).

2. The process according to claim 1, wherein R is methyl, ethyl, tert-butyl, trimethylsilyl, or the two R in A when A is NR$_2$ form together a five membered ring, and R' is hydrogen.

3. The process according to claim 1, wherein the metal-containing compound contains Ti, Ta, Mn, Mo, W, Al, Co, Ga, Ge, Sb, or Te.

4. The process according to claim 1, wherein the metal-containing compound is a metal halide.

5. The process according to claim 1, wherein the process optionally further comprises decomposing the compound of general formula (I) or (II) that adsorbs to a surface of the solid substrate, and wherein the process is performed at least twice.

6. The process according to claim 1, wherein the compound of general formula (I) has a molecular weight of not more than 600 g/mol.

7. The process according to claim 1, wherein the compound of general formula (I) has a vapor pressure at least 1 mbar at a temperature of 200° C.

* * * * *